(12) United States Patent
Ringer et al.

(10) Patent No.: US 10,461,689 B2
(45) Date of Patent: Oct. 29, 2019

(54) METHOD FOR TESTING THE STRINGS OF SOLAR MODULES OF A PHOTOVOLTAIC SYSTEM, AND PHOTOVOLTAIC INVERTER FOR CARRYING OUT THE METHOD

(71) Applicant: FRONIUS INTERNATIONAL GMBH, Pettenbach (AT)

(72) Inventors: Thomas Ringer, Grieskirchen (AT); Hannes Schwarzkogler, Steinerkirchen/Traun (AT); Johannes Schubert, Gunskirchen (AT); Thomas Sieberer, Voecklamarkt (AT)

(73) Assignee: FRONIUS INTERNATIONAL GMBH, Pettenbach (AT)

( * ) Notice: Subject to any disclaimer, the term of this patent is extended or adjusted under 35 U.S.C. 154(b) by 228 days.

(21) Appl. No.: 15/569,935

(22) PCT Filed: Apr. 28, 2016

(86) PCT No.: PCT/EP2016/059516
§ 371 (c)(1),
(2) Date: Oct. 27, 2017

(87) PCT Pub. No.: WO2016/174150
PCT Pub. Date: Nov. 3, 2016

(65) Prior Publication Data
US 2018/0159466 A1 Jun. 7, 2018

(30) Foreign Application Priority Data

Apr. 30, 2015 (EP) .................................... 15165968

(51) Int. Cl.
*G01R 31/26* (2014.01)
*H02S 50/10* (2014.01)
(Continued)

(52) U.S. Cl.
CPC .............. *H02S 50/10* (2014.12); *G01R 31/40* (2013.01); *H02J 3/385* (2013.01); *H02S 40/32* (2014.12);
(Continued)

(58) Field of Classification Search
CPC . H02J 3/38; H02J 3/385; G01R 31/40; H02M 3/04; H02M 7/44; H02M 7/5387;
(Continued)

(56) References Cited

U.S. PATENT DOCUMENTS 9,722,425 B2 8/2017 Pape et al.
2012/0049855 A1* 3/2012 Crites ............... H01L 31/02021
324/537

(Continued)

FOREIGN PATENT DOCUMENTS

DE 10 2005 030 907 A1 1/2007
DE 10 2012 104 560 A1 11/2013
(Continued)

OTHER PUBLICATIONS

International Search Report of PCT/EP2016/059516, dated Jul. 5, 2016.
(Continued)

*Primary Examiner* — Melissa J Koval
*Assistant Examiner* — Courtney G McDonnough
(74) *Attorney, Agent, or Firm* — Collard & Roe, P.C.

(57) ABSTRACT

A method tests the strings of a photovoltaic system, and a photovoltaic inverter has for each string a relay, a current-measuring device and a voltage measuring device, connected to a control device. The control device is designed to control each relay, each current-measuring device and the voltage-measuring device in such a way as to automatically ascertain at least individual values of the U/I characteristic curve of each string. The control device is connected to at
(Continued)

least one interface for connection to sensors for measuring environmental parameters in the region of the string and is connected to a memory for storing the ascertained values for creating a test report. The control device is further designed to convert the ascertained values optionally to Standard Test Conditions under defined environmental conditions and to compare the ascertained values with values which are stored in the memory.

15 Claims, 4 Drawing Sheets

(51) Int. Cl.
*G01R 31/40* (2014.01)
*H02J 3/38* (2006.01)
*H02S 40/32* (2014.01)
*H02M 7/5387* (2007.01)
*H02M 1/00* (2006.01)
*H02M 7/44* (2006.01)

(52) U.S. Cl.
CPC ............ *H02M 7/44* (2013.01); *H02M 7/5387* (2013.01); *H02M 2001/007* (2013.01); *Y02E 10/58* (2013.01)

(58) Field of Classification Search
CPC .. H02M 2001/007; H02S 50/10; H02S 40/32; Y02E 10/58
See application file for complete search history.

(56) References Cited

U.S. PATENT DOCUMENTS

| | | | |
|---|---|---|---|
| 2013/0285670 A1* | 10/2013 | Yoshidomi | ........... G01R 31/025 |
| | | | 324/510 |
| 2014/0188410 A1 | 7/2014 | Kerrigan et al. | |
| 2015/0270785 A1 | 9/2015 | Idt et al. | |

FOREIGN PATENT DOCUMENTS

| | | |
|---|---|---|
| DE | 10 2012 214 177 A1 | 2/2014 |
| EP | 170 596 A2 | 1/2002 |
| JP | H10-63358 A | 3/1998 |
| JP | 2013-065797 A | 4/2013 |

OTHER PUBLICATIONS

International Preliminary Report on Patentability in PCT/EP2016/059516, dated Nov. 16, 2017.
European Search Report in EP 15165968.7-1809, dated Jun. 16, 2015, together with an English translation of relevant parts.

* cited by examiner

METHOD FOR TESTING THE STRINGS OF SOLAR MODULES OF A PHOTOVOLTAIC SYSTEM, AND PHOTOVOLTAIC INVERTER FOR CARRYING OUT THE METHOD

CROSS REFERENCE TO RELATED APPLICATIONS

This application is the National Stage of PCT/EP2016/059516 filed on Apr. 28, 2016, which claims priority under 35 U.S.C. § 119 of European Application No. 15165968.7 filed on Apr. 30, 2017, the disclosures of which are incorporated by reference. The international application under PCT article 21(2) was not published in English.

The invention relates to a method for testing the strings of a photovoltaic system which generate a DC voltage, with at least one photovoltaic inverter for converting the DC voltage of the strings into an AC voltage for feeding into a supply network and/or into a consumer load, with two connecting lines per string, respectively, with a control device, a DC/DC converter, an intermediate circuit, a DC/AC converter, and a MPP tracker, wherein each string can be connected via the control device individually by means of switching contacts of relays in each connecting line in order to ascertain at least individual values of the U/I characteristic curve of each string by means of current-measuring devices arranged at one connecting line for each string, respectively, and integrated in the photovoltaic inverter, and by means of a voltage-measuring device.

Furthermore, the invention relates to a photovoltaic inverter for converting the DC voltage of the strings into an AC voltage for feeding into a supply network and/or into a consumer load, with two connecting lines, respectively, of a control device, a DC/DC converter, an intermediate circuit, a DC/AC converter, and with a MPP tracker, wherein in each connecting line for each string a switching contact of a relay is arranged, and wherein in one connecting line, respectively, for each string a current-measuring device is arranged, respectively, and, furthermore, a voltage-measuring device for measuring the voltage of each string is provided.

Photovoltaic systems consist of a corresponding number of solar modules which, normally, are interconnected in series to form so-called strings and are connected to the DC input of at least one inverter. The photovoltaic inverter converts the DC voltage generated by the solar modules into an AC voltage and makes it available for feeding into a supply network or for the supply to consumer loads. For the optimum exploitation of the solar energy, by means of a MPP (Maximum Power Point) tracker the loading of a solar module is optimized to a maximum power yield by the fact that at least individual points of the U/I characteristic curve of the solar module or of the series connection of several solar modules are ascertained and the inverter is controlled such that the solar module is operated at the so-called MPP (Maximum Power Point) in which the provided power is at a maximum.

Apart from the mentioned measurements at the strings of solar modules during the operation of the photovoltaic system, further methods for testing the strings of solar modules of a photovoltaic system are required or prescribed prior to the first commissioning of or after alterations at the photovoltaic system. Normally, such compulsory commissioning tests are carried out with external measuring devices and by a manual intervention into the photovoltaic system. This, however, correspondingly requires a lot of time and staff.

DE 10 2012 214 177 A1 for instance describes a method for commissioning an inverter of a photovoltaic system, which method can be carried out in a particularly simple, inexpensive and quick manner and also without turning-off of the photovoltaic system. In essence, however, it is a matter of making available—via a memory card—data and information which are necessary for the operation and the setting-up of the inverter. Measurements for testing the state of the strings of solar modules or commissioning test are, however, not carried out.

Further methods for testing the strings of solar modules of a photovoltaic system are known from JP 2013065797 A, JP H10 63358 A, DE 10 2012 104560 A1 and DE 10 2005 030907 A1. It is impossible to draw any conclusions from the measurement results with regard to checking the characteristics of the solar modules as guaranteed by the manufacturer.

The object of the present invention is to create a method for testing and an inverter by means of which a testing of the strings of solar modules can be carried out as quickly and efficiently as possible. Drawbacks of known testing methods and inverters shall be avoided or at least reduced.

The object according to the invention is solved by an abovementioned method for testing, wherein the at least individual values of the U/I characteristic curve of each string are automatically ascertained and, additionally, environmental parameters in the region of the string are measured and transferred to the control device, which values will be stored in a memory connected to the control device for creating a test report, and the ascertained values are optionally converted into Standard Test Conditions under defined environmental conditions and compared with values which are stored in the memory.

The subject method for testing stands out due to the fact that measurements at all strings of solar modules can be carried out without any external measuring devices and without any intervention in the photovoltaic system from the outside. By the switching contacts in each connecting line (of the positive as well as also of the negative line of the strings of solar modules) all strings of solar modules can be connected or disconnected one after the other and, thus, can be measured individually. Usually, the switching contacts of the relays are disposed in the inverter, i.e. in the interconnecting lines of the connecting lines for the strings with the DC/DC converter of the inverter. Said interconnecting lines can be regarded as an extension of the connecting lines. Normally, the connecting lines will be connected to an input of a connecting block which, in most cases, has a so-called DC-disconnector and which, at the output, is connected to the corresponding components of the inverter. Said connection is preferably carried out directly via a printed circuit board track on which also the switching contacts are arranged. Behind the switching contacts, the connecting lines of the same polarity are brought together and connected with the DC/DC converter with a subsequent intermediate circuit. In order to carry out the respective measurement at each string of solar modules, corresponding current-measuring devices integrated in the photovoltaic inverter and at least one voltage-measuring device are used which transfer their measurement values to the control device for further processing. The measurement values and values derived therefrom will be stored in a memory connected to the control device. From said memory, the values can be read out on request or automatically or they can be automatically forwarded to desired sites for the creation of a test report. The method for testing can be used for the commissioning test as well as for the continuous monitoring of the state of each string of solar modules. In addition to the recording of at least individual values of the U/I characteristic curve of the strings of solar modules, also polarity measurements and measurements of the insulation resistance can be carried out in a particularly simpler and faster way. The duration of the measurement per string of solar modules lies in the range of few seconds, in particular even below 1 second, whereas conventional commissioning tests in which external measuring devices are used and where there is a manual exertion of influence on the photovoltaic system have occupied a multiple in terms of time, as the external measuring device would have to be connected manually to each string. In contrast to the conventional method, and due to its simplicity and due to the fact that it can be carried out quickly, the subject method for testing can be used also at regular or irregular time intervals during operation of the photovoltaic system, and from the created test report important knowledge and findings with regard to the state of the strings of solar modules and their function can be derived. By the additional measurement of environmental parameters in the region of the string of the solar modules and the transfer of the measurement values to the control device, important additional information can be included into the test report or can be taken into account in the processing of the measurement values. For a comparison of the measurement results with the statements of the manufacturer or with results of measurements carried out at a later point of time it is decisive that the measurements were or are carried out under comparable environmental conditions in the region of the solar modules.

Due to the fact that the ascertained values are optionally converted to Standard Test Conditions under defined environmental conditions and are compared with values which are stored in the memory, the operator of the photovoltaic system can be informed about failures or age-related malfunctions, and a correction or repair of the malfunction or failure or a replacement of defective solar modules can be initiated. For such comparisons, a conversion of the values to so-called "Standard Test Conditions" can be useful. Standard Test Conditions are temperature and irradiation conditions given and defined by the manufacturer, under which, for instance, the values are stated in the data sheets. As said temperature and irradiation conditions only very rarely coincide, quite often also conversion formulas for the conversion of the values in case of diverging temperature or irradiation are stated by the manufacturers. Consequently, such converted values can be used for comparisons having an increased informative value.

Advantageously, the complete U/I characteristic curve inclusive of the open-circuit voltage and the short-circuit current of each string are ascertained and stored in the memory. From the complete U/I characteristic curve of each string of solar modules, important information about the state of the solar modules can be derived, and it can for instance be checked whether the solar modules actually have the characteristics as guaranteed by the manufacturer.

The at least individual values of the U/I characteristic curve of each string can be ascertained and stored on command, at predefined time intervals, or in dependence on certain operational events or operating parameters. Due to the particularly simple and quick practicability, the method for testing can be carried out substantially more often at each string than it is the case with the conventional method which, normally, is only carried out on the occasion of the commissioning of the system or after alterations at the system. The method for testing can, for instance, be carried out on command or on request, which request can be sent to the photovoltaic system on the spot or also from a remote location. Furthermore, a test can also be carried out at predefined time intervals, for example once per quarter of a year or once per month. Finally, also certain operational events or operating parameters can trigger a test, as e.g. certain environmental influences which are measured with corresponding sensors.

As an environmental parameter in the region of the string the temperature can be measured by means of at least one temperature sensor and can be transferred to the control device. Furthermore, the light radiation in the region of the string can be measured by means of an irradiation sensor and can be transferred to the control device so that also the weather conditions and the solar irradiation conditions can be included into the measurement. The light radiation will be measured by means of corresponding sensors at the solar modules. Also the amount of rain in the region of the string can be measured by means of a rain sensor and can be transferred to the control device so that the influencing parameters can be taken into account in particular for the measurements of the insulation resistance. Experience shows that the insulation resistance is decreased during rain. Hence, for an error evaluation it is important to also know the humidity or the amount of rain during the measurement.

The values stored in the memory can be transmitted to a data interface, in particular to a network interface, in particular to an interface for the Internet. Via such a data interface or network interface the values ascertained during the method for testing and possibly derived therefrom can be forwarded to respective sites for documentation purposes or for statistical processings. At such external sites, the collected test reports can be processed further and can be made available to the interested parties.

According to another feature of the invention, the values can also be transmitted automatically to a specified address in the network, in particular in the Internet. For instance, when certain operational events or operating parameters arise, methods for testing can be carried out automatically and can be transmitted to specified recipients, where the values will be processed further and possible measures can be initiated. The test reports can for instance also be sent automatically via email or SMS to the operator of the photovoltaic system.

Advantageously, the polarity of each string is ascertained and stored in the memory. By the measurement of the polarity of each string, prior to the commissioning of the photovoltaic system or after maintenance work at the solar modules polarity reversals can be detected and damages at the photovoltaic system or at the inverters as well as power losses can be prevented. The result of the polarity measurement can be integrated into the test report.

Also the insulation resistance of each string can be ascertained and stored in the memory, as said parameter also provides an important information about the state of the solar modules. For the reliable measurement of the insulation resistance of each string it is absolutely necessary to provide a switching contact of a relay in each connecting line of the string so that no insulation errors of other strings will influence the measurement result. The measured insulation resistances of each string can also be integrated into the test report.

According to a further feature of the invention, in the case of inadmissible deviations of the ascertained values and of the values optionally converted to Standard Test Conditions, with the values stored in the memory a warning can be output whereby the operator of the photovoltaic system is informed in good time about failures or age-related malfunctions, and whereby a correction or repair of the malfunctions or failures or a replacement of defective solar modules can be initiated quickly.

The object according to the invention is solved also by a subject photovoltaic inverter in which each relay, each current-measuring device and the voltage-measuring device are connected to the control device and said control device is designed to control each relay, each current-measuring device and the voltage-measuring device in such a way as to automatically ascertain at least individual values of the U/I characteristic curve of each string, and said control device is connected to at least one interface for connection to sensors for measuring environmental parameters in the region of the string, and a memory which is connected to the control device is provided for storing the ascertained values for creating a test report, and wherein the control device is further designed to convert the ascertained values optionally to Standard Test Conditions under defined environmental conditions and to compare said ascertained values with values which are stored in the memory. By means of the integrated relays, current-measuring device and at least one voltage-measuring device and without utilizing external measuring devices the subject photovoltaic inverter is able to automatically carry out commissioning tests and tests of the state of each string of solar modules. The required hardware components can be integrated into the photovoltaic inverter in a relatively simple and inexpensive manner. The corresponding control of the method for testing can be implemented in the control device by means of software technology. In larger photovoltaic systems with a plurality of photovoltaic inverters with corresponding devices for carrying out methods for testing, all strings can be measured automatically in a rapid manner and, thus, under identical similar environmental conditions, which has not been possible before due to the long measurement times and/or change-over times. Thus, in particular in large photovoltaic systems, test reports of each string are provided under comparable conditions with regard to temperature and irradiation and, possibly, the rain. With regard to further advantages of the photovoltaic inverter, reference is made to the above description of the method for testing. The control device is connected to at least one interface for connection to sensors for measuring environmental parameters in the region of the string so that the environmental parameters in the region of the string can be integrated into the test. By the additional detection of the environmental conditions, the measurements can also be performed under prescribed standard conditions (Standard Test Conditions STC) under which, normally, the data of the solar modules specified by the manufacturer are stated. Thus, by means of the test report, deviations from guaranteed characteristics of the solar modules can be identified and transmitted to the module manufacturer. Such measurements and tests, in particular at regular times during the operation of the photovoltaic system, have not been possible so far or just with an enormous effort.

Preferably, the control device is designed to control each relay, each current-measuring device and the voltage-measuring device in such a way that the complete U/I characteristic curve inclusive of the open-circuit voltage and of the short-circuit current of each string will be ascertained and will be stored in the memory.

The control device can be connected to at least one interface for connection to a temperature sensor so that the temperature in the region of the solar modules can be integrated into the test.

Furthermore, the control device can be connected to an interface for connection to an irradiation sensor. Said irradiation sensor is arranged at least one solar module and measures the light radiation provided by the sun. The measurement of temperature and irradiation enables a conversion of the current values into values under Standard Test Conditions STC as specified by the manufacturer, which can enable a comparison of measurement values ascertained under various environmental conditions.

Finally it is advantageous if the control device is connected to at least one interface for connection to a rain sensor. As already explained above, the additional detection of the rain or of the air humidity is of importance for the measurement of the insulation resistance of the strings.

The control device can also be connected to a data interface, in particular to a network interface which can be connected to a network, in particular to the Internet. Via said data interface or network interface the test report and, possibly, further measurement results can be transmitted by wire or wirelessly to various facilities.

The control device is preferably designed to control each relay, each current-measuring device and the voltage-measuring device in such a way that the polarity of each string can be ascertained. Thereby a polarity reversal of the solar modules can be detected in good time.

Moreover, the control device can be designed to control each relay, each current-measuring device and the voltage-measuring device in such a way that the insulation resistance of each string of solar modules can be ascertained. The insulation resistance is an important parameter for the state of the solar module.

The voltage-measuring device can be formed by the voltage-measuring device of the MPP tracker. Due to this, the expenditure as to hardware is reduced, as for carrying out the method for testing and for the equipment of the photovoltaic inverter only the relays and the corresponding switching contacts for connection and disconnection of each string and one current-measuring device per connecting line are required.

The invention will be explained in further detail by means of the attached drawings, wherein.

Figure 1:
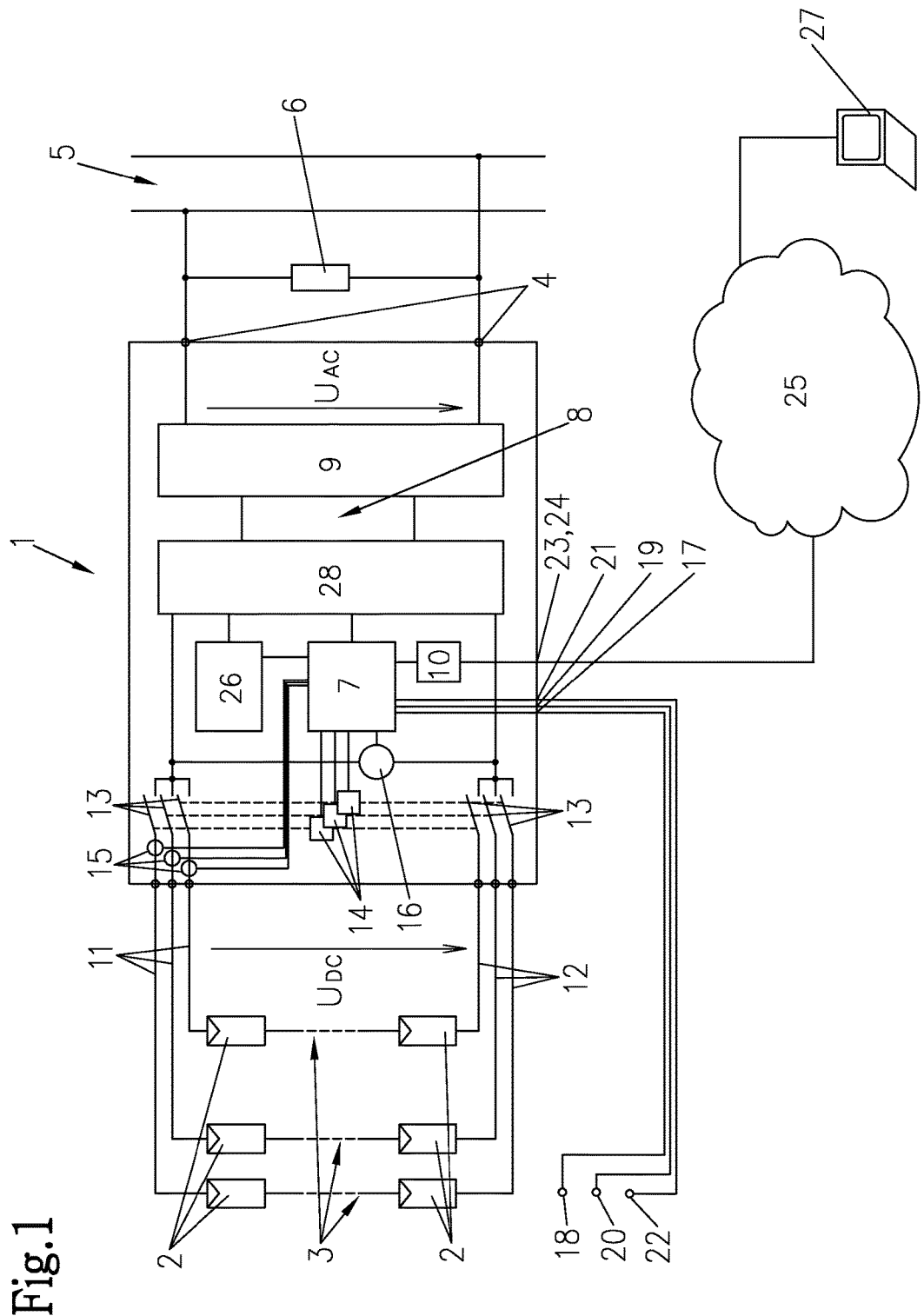
FIG. 1 shows a block diagram of a photovoltaic system.

FIG. 1 shows a block diagram of a photovoltaic system which has at least one photovoltaic inverter 1 for converting the DC voltage $U_{DC}$ of at least one solar module 2 into an AC voltage $U_{AC}$. Generally, several solar modules 2 are interconnected in series to form so-called strings 3 and are connected to the DC input of the photovoltaic inverter 1. Normally, several parallel strings 3 are connected at one photovoltaic inverter 1. In case of larger photovoltaic systems, a plurality of photovoltaic inverters 1 are arranged in parallel according to the power performance of the system. The AC voltage $U_{AC}$ generated by the photovoltaic inverter 1 will be connected via the AC output 4 of the photovoltaic inverter 1 to a supply network 5 and/or to a consumer load 6. The strings 3 of solar modules 2 are connected via two connecting lines 11, 12, respectively, with the DC input of the photovoltaic inverter 1. The photovoltaic inverter 1 comprises as components at least a control device 7, a DC/DC converter 28, an intermediate circuit 8, a DC/AC converter 9 and a so-called MPP (Maximum Power Point) tracker 26 via which the power maximum of the solar modules 2 can be ascertained so that the photovoltaic inverter 1 can always be operated at the so-called MPP (Maximum Power Point), i.e. the power maximum of the solar modules 2. Correspondingly, the components can also be combined. For instance, the MPP tracker 26 could also fulfill the function of the DC/DC converter 28. According to the invention, in each connecting line 11, 12 of each string 3 of solar modules 2 there is arranged a switching contact 13 of a relay 14 so that for carrying-out the method for testing one string 3 of solar modules 2 after the other can be connected and, thus, the state of each string 3 of solar modules 2 can be measured individually and independently of the other strings 3 of solar modules 2. Hence, the method for testing will be carried out step by step. Usually, the switching contacts 13 in the positive connecting line 11 and in the negative connecting line 12 belong to one common relay 14. Each relay 14 is connected to the control device 7 so that a corresponding driving of the switching contacts 13 and thus a corresponding connecting and disconnecting of the strings 3 of solar modules 2 can be carried out during the method for testing. In addition, in one connecting line 11 or 12, respectively, of each string 3 of solar modules 2 a current-measuring device 15 is arranged via which the current provided by all solar modules 2 of each string 3 which are connected in series can be ascertained. Via a voltage-measuring device 16 the voltage provided by all solar modules 2 of each string 3 is ascertained. The current-measuring device 15 and the voltage-measuring device 16 are also connected to the control device 7. Thus, by the current-measuring device 15 and the voltage-measuring device 16 which are integrated in the photovoltaic inverter 1, the method for testing the strings 3 of solar modules 2 can be carried out automatically and quickly without the utilization of any external measurement devices and without a manual influence on the photovoltaic system. The voltage-measuring device 16 can also be formed by the voltage-measuring device (not shown) usually integrated in the MPP tracker 26. The ascertained values will be stored in a memory 10 where they remain stored until the creation of a test report. By a corresponding power control not only individual points of the U/I characteristic curve of the strings 3 of solar modules 2, but also the complete U/I characteristic curve of each string 3 of solar modules 2, inclusive of also the open-circuit voltage $U_{LL}$ and the short-circuit current $I_{KS}$, can be ascertained and stored in the memory 10.

The illustrated photovoltaic inverter 1 enables a fast testing of each string 3 of solar modules 2 within one second or even less, which, on the one hand, can be performed for the obligatory commissioning test (i.e. prior to the first feed-in), but which, on the other hand, can also be performed for the testing of the system during ongoing operation. The method for testing can be triggered manually at an input/output device (not shown) of the photovoltaic system or on command from the outside, or it can be carried out at predefined time intervals Δt or also in dependence on certain operational events or operating conditions. It can, for instance, also be provided automatically that after a switching-off of the photovoltaic system or in case of certain environmental conditions, like e.g. certain temperatures, irradiations or rain situations, a measurement will be triggered. For the ascertainment of the environmental parameters, temperature sensors 18, irradiation sensors 20 or rain sensors 22 can be connected via corresponding interfaces 17, 19 or 21 to the photovoltaic inverter 1 or its control device 7. On the basis of the environmental parameters a conversion to Standard Test Conditions (STC) can be carried out and optionally stored. Thus it is possible to regularly—and not necessarily under STC environmental parameters—check the characteristics of the solar modules 2 as guaranteed by the manufacturer. Thereby, also conclusions with regard to the maximum possible power of the solar modules 2 can be drawn, whereby profit losses of the photovoltaic system can be detected early.

In order to be able to provide the values stored in the memory 10 also to remote sites for the creation of the test report, the memory 10 or the control device 7 is preferably connected to a data interface 23, in particular to a network interface 24, via which the photovoltaic inverter 1 can be connected to a network, in particular to the Internet 25. Thus, the values stored in the memory 10 can be made available to each site, in particular to each selected computer 27 in the network, in particular in the Internet 25, for the creation of the test report, and the values can be processed further at said sites.

To the carrying-out of the method for testing there belong in particular also the measurement of the polarity of each string 3 of solar modules 2 and the measurement of the insulation resistance $R_I$ of each string 3 of solar modules 2.

Figure 2:
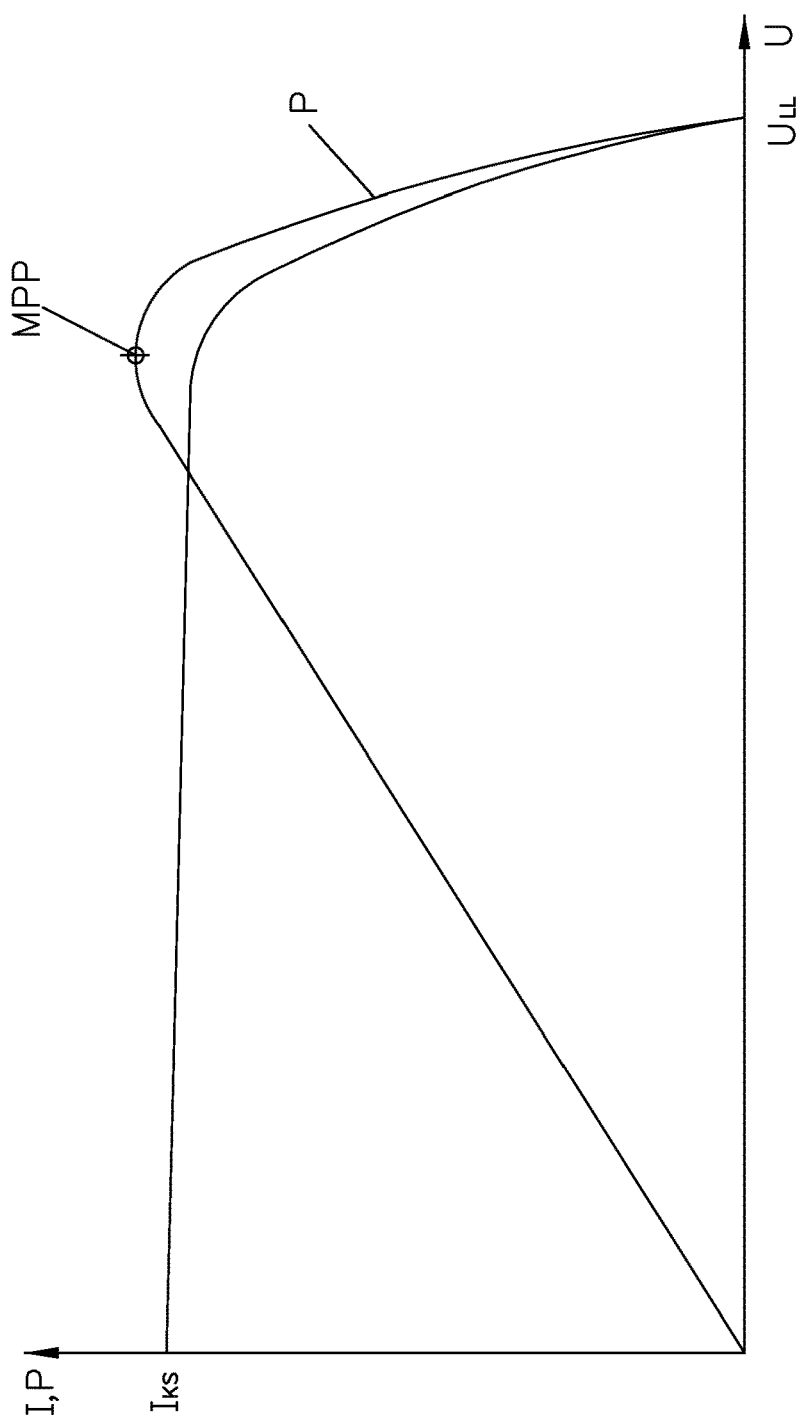
FIG. 2 shows a U/I characteristic curve of a string of solar modules.

FIG. 2 shows a usual U/I characteristic curve of a solar module and the pertaining power curve. The U/I characteristic curve starts at a certain short-circuit current $I_{KS}$ and extends in a manner falling down to an open-circuit voltage $U_{LL}$. At a certain point of the U/I characteristic curve, the solar module or the series connection of several solar modules provides the maximum power. Said desired operating point is called MPP (Maximum Power Point). By means of so-called MPP trackers—which normally are integrated in the photovoltaic inverter—the characteristic curve of the solar module or of the series connection of several solar modules is ascertained at least in part, and a control is carried out in such a way that the solar module will be operated at the MPP.

By means of the subject method for testing and by means of the correspondingly equipped photovoltaic inverters it is possible to detect at least a part of the U/I characteristic curve, preferably the complete U/I characteristic curve inclusive of the short-circuit current $I_{KS}$ and the open-circuit voltage $U_{LL}$, prior to the commissioning of the photovoltaic system, but also during ongoing operation, and, thus, to create a binding test record or to detect changes at the solar modules for instance due to contaminations, climatic influences or aging. The power produced thereby can be fed correspondingly into the supply network.

Figure 3:
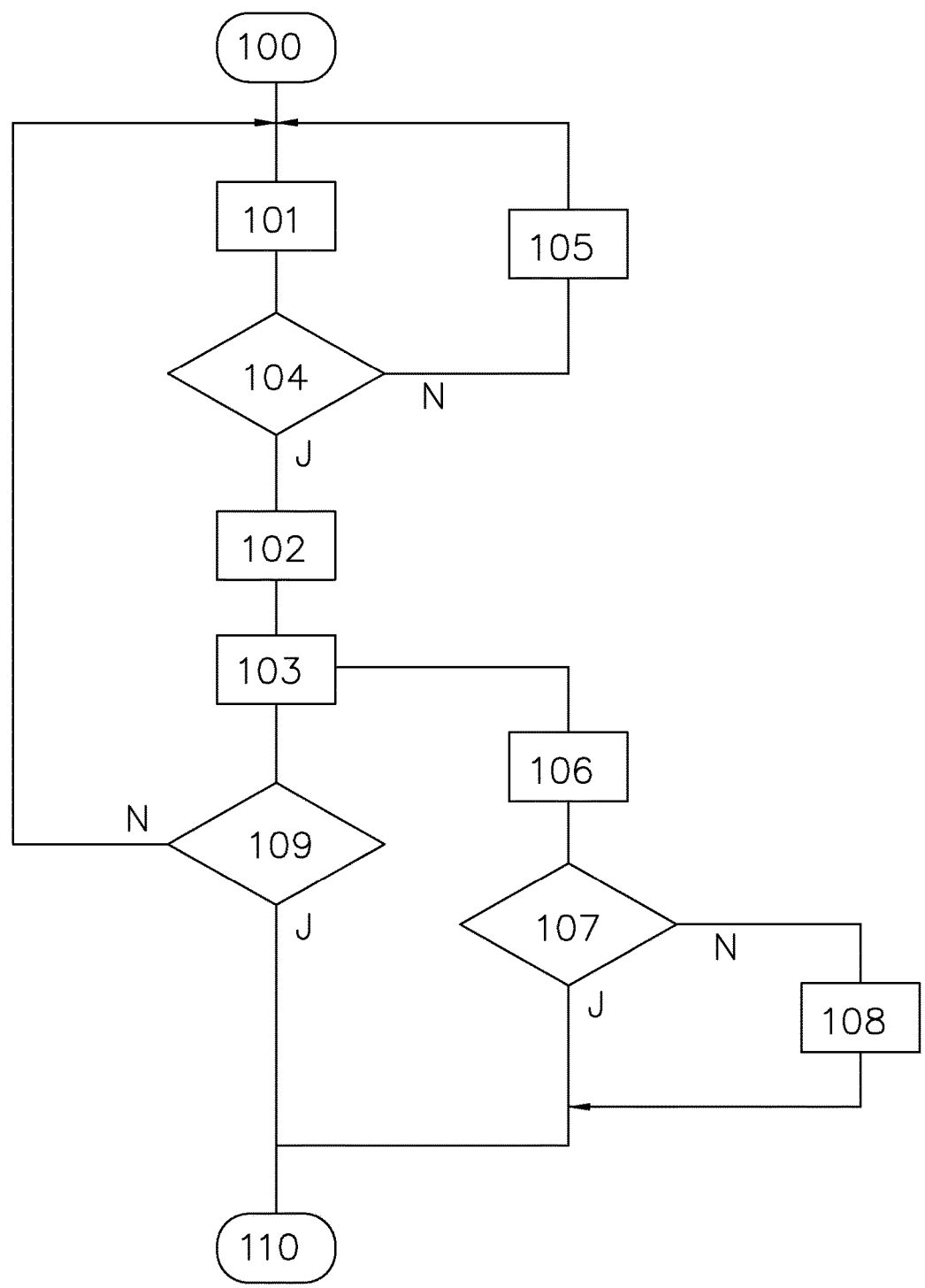
FIG. 3 shows a flow diagram for the illustration of the method for testing the strings of solar modules of a photovoltaic system.

FIG. 3 shows a flow diagram of the method according to the invention for testing the strings of solar modules of a photovoltaic system. After the start of the method (block 100), a test of the polarity of each string of solar modules is carried out (block 101). Then the insulation resistance $R_I$ of each string of solar modules is measured (block 102). Thereupon the feed-in operation of the photovoltaic system is started and the U/I characteristic curve of each string of solar modules is ascertained at least in part, preferably completely (inclusive of short-circuit current $I_{KS}$ and open-circuit voltage $U_{LL}$) (block 103). After the polarity measurement (block 101), usually a query (block 104) will be made as to the fact whether the polarity is correct, and only in case of a correct polarity of the string of solar modules the measurement will be continued. When it is determined that there is a polarity reversal, a corresponding warning will be issued (block 105), and it will be returned to the start of the measurement or the measurement will be interrupted until the correct polarity has been restored. After the detection of the U/I characteristic curve of all strings of solar modules the corresponding values will be written into the memory (block 106) and will be made available for the creation of a test report. Optionally, the values stored in the memory can be compared with limit values or with previous values (query 107), and in case of an inadmissible deviation a warning can be issued (block 108). According to query 109, the measurement or the method for testing will be started once again under certain conditions like e.g. upon occurrence of certain operational events or after expiration of preset periods of time Δt. According to step 110, the method for testing will be brought to an end.

Figure 4:
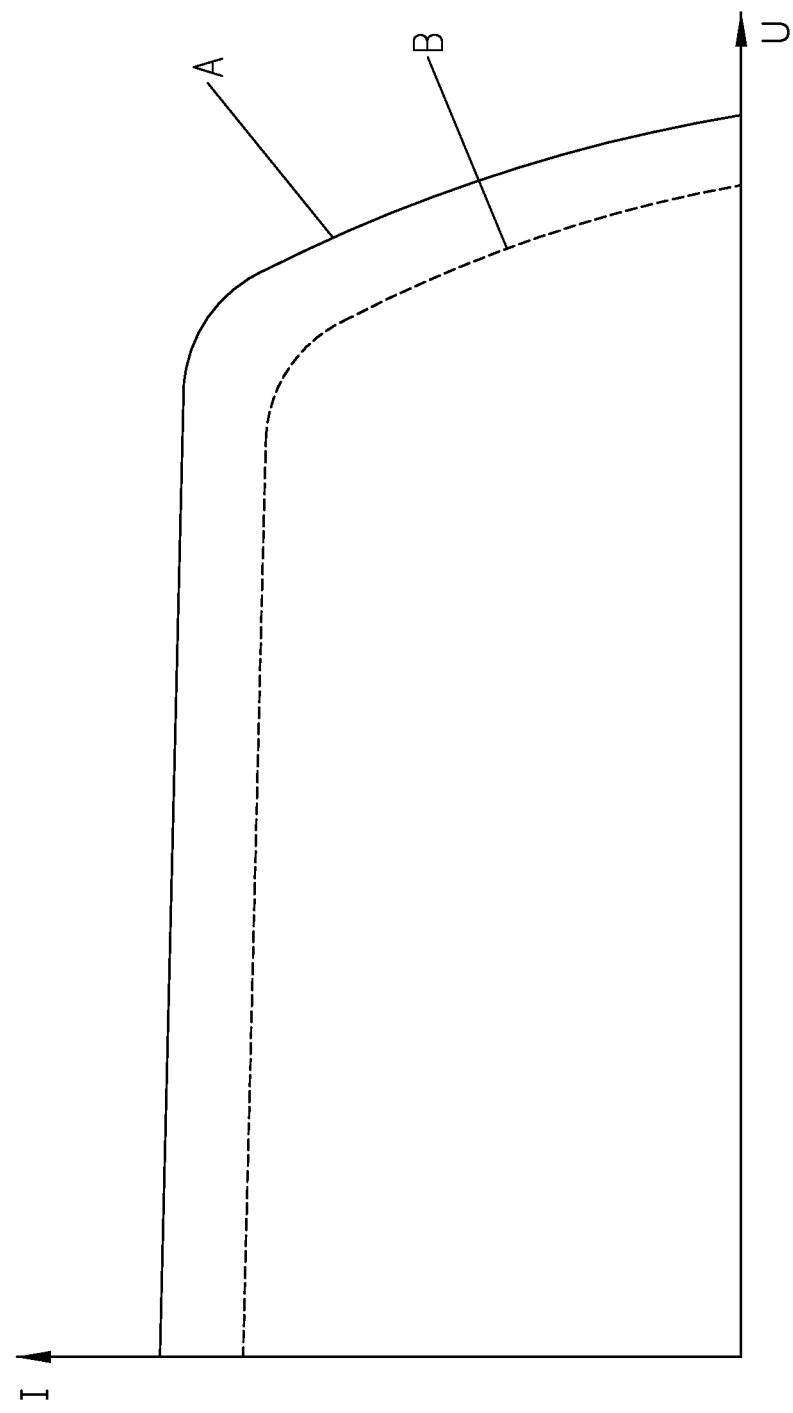
FIG. 4 shows a U/I characteristic curve of a string of solar modules and under various conditions.

Finally, FIG. 4 shows a U/I characteristic curve of a solar module under various conditions. The characteristic curve A is characteristic for a new solar module, whereas curve B shows the characteristics of an aged solar module. Thus, in case of repeated measurements and tests of all strings of solar modules, the aging of the solar module can be determined effectively, and, in the event of a dropping below certain threshold values, a timely replacement of the solar module can be prompted so that once again the optimum power can be obtained from the solar energy. Especially in case of such measurements and comparisons the measurement under or the conversion to the Standard Test Conditions at a defined temperature and irradiation is of particular importance.

What is claimed is:

1. A method for testing the strings of a photovoltaic system which generate a DC voltage ($U_{DC}$), with at least one photovoltaic inverter for converting the DC voltage ($U_{DC}$) of the strings into an AC voltage ($U_{AC}$) for feeding into a supply network and/or into a consumer load, with two connecting lines per string, respectively, with a control device, a DC/DC converter, an intermediate circuit, a DC/AC converter, and an MPP tracker, wherein each string is connectable via the control device individually via switching contacts of relays in each connecting line in order to detect individual values of a U/I characteristic curve of each string via current-measuring devices arranged at one connecting line for each string, respectively, and integrated in the photovoltaic inverter and via a voltage-measuring device, wherein the method comprises:

detecting a polarity of each string as well as an insulation resistance of each string and storing the detected polarity and insulation resistance of each string in a memory connected to the control device, starting a feed-in operation of the photovoltaic system, detecting individual values of the U/I characteristic curve of each string automatically on command, at predefined time intervals (Δt) or in dependence on operational events or operating parameters, and storing the detected individual values of the U/I characteristic curve of each string in the memory, measuring environmental parameters in a region of the strings and transferring the measured environmental parameters to the control device, which parameters will be stored in the memory for creating a test report, comparing the detected values of the U/I characteristic curve of each string with values which are stored in the memory, and issuing a warning in case of inadmissible deviations of the detected values of the U/I characteristic curve of each string with the values stored in the memory.

2. The method for testing according to claim 1, wherein the complete U/I characteristic curve inclusive of the open-circuit voltage ($U_{LL}$) and the short-circuit current ($I_{KS}$) of each string are ascertained and stored in the memory.

3. The method for testing according to claim 1, wherein as environmental parameters the temperature, the irradiation and/or the amount of rain in the region of the string are measured via at least one temperature sensor, one irradiation sensor and/or one rain sensor.

4. The method for testing according to claim 1, wherein the values stored in the memory are transmitted to a data interface.

5. The method for testing according to claim 4, wherein the values will be transmitted automatically to a specified address in the network.

6. The method for testing according to claim 1, further comprising:

converting the detected values of the U/I characteristic curve of each string to Standard Test Conditions under defined environmental conditions based on the stored environmental parameters and comparing the converted values with values which are stored in the memory, and issuing a warning in case of inadmissible deviations of the detected values of the U/I characteristic curve of each string and of the converted values with the values stored in the memory.

7. The method for testing according to claim 1, wherein the values stored in the memory are transmitted to a network interface.

8. The method for testing according to claim 1, wherein the values stored in the memory are transmitted to an interface for the Internet.

9. The method for testing according to claim 8, wherein the values will be transmitted automatically to a specified address in the Internet.

10. A photovoltaic inverter for converting a DC voltage of strings of a photovoltaic system into an AC voltage ($U_{AC}$) for feeding into a supply network and/or into a consumer load, photovoltaic inverter comprising two connecting lines per string, respectively, a control device, a DC/DC converter, an intermediate circuit, a DC/AC converter, and an MPP tracker, wherein each string is connectable via the control device individually via switching contacts of relays in each connecting line in order to detect individual values of a U/I characteristic curve of each string via current-measuring devices arranged at one connecting line for each string, respectively, and integrated in the photovoltaic inverter, and via a voltage-measuring device wherein the control device is configured to control operation of the relay, and further configured to:

detect a polarity of each string as well as an insulation resistance ($R_I$) of each string and store the detected polarity and insulation resistance of each string in a memory connected to the control device, start a feed-in operation of the photovoltaic system, detect individual values of the U/I characteristic curve of each string automatically on command, at predefined time intervals (Δt) or in dependence on operational events or operating parameters, and store the detected individual values of the U/I characteristic curve of each string in the memory, measure environmental parameters in a region of the strings and transfer the measured environmental parameters to the control device, which parameters will be stored in the memory for creating a test report, compare the detected values of the U/I characteristic curve of each string with values which are stored in the memory, and issue a warning in case of inadmissible deviations of the detected values of the U/I characteristic curve of each string with the values stored in the memory.

11. The photovoltaic inverter according to claim 10, wherein the control device is designed to control each relay, each current-measuring device and the voltage-measuring device in such a way as to ascertain and store in the memory the complete U/I characteristic curve inclusive of the open-circuit voltage ($U_{LL}$) and the short-circuit current ($I_{KS}$) of each string.

12. The photovoltaic inverter according to claim 10, wherein the control device is connected to at least one interface for connection to a temperature sensor, one interface for connection to an irradiation sensor, and/or at least one interface for connection to a rain sensor.

13. The photovoltaic inverter according to claim 10, wherein the control device is connected to a data interface which can be connected to a network.

14. The photovoltaic inverter according to claim 10, wherein the control device is further configured to:
   convert the detected values of the U/I characteristic curve of each string to Standard Test Conditions under defined environmental conditions based on the stored environmental parameters and compare the converted values with values which are stored in the memory, and
   issue a warning in case of inadmissible deviations of the detected values of the U/I characteristic curve of each string and of the converted values with the values stored in the memory.

15. The photovoltaic inverter according to claim 10, wherein the control device is connected to a network interface which can be connected to the Internet.

* * * * *

UNITED STATES PATENT AND TRADEMARK OFFICE
CERTIFICATE OF CORRECTION

PATENT NO. : 10,461,689 B2
APPLICATION NO. : 15/569935
DATED : October 29, 2019
INVENTOR(S) : Ringer et al.

Page 1 of 1

It is certified that error appears in the above-identified patent and that said Letters Patent is hereby corrected as shown below:

In the Claims

In Column 10, Line 38 (Line 4 of Claim 10) before "photovoltaic" please insert: --the--.

Signed and Sealed this
Tenth Day of December, 2019

Andrei Iancu
*Director of the United States Patent and Trademark Office*